US010565107B2

(12) United States Patent
Decloedt et al.

(10) Patent No.: US 10,565,107 B2
(45) Date of Patent: Feb. 18, 2020

(54) AUTO ADDRESSING USING FUNCTIONAL CONNECTION

(71) Applicant: SEMICONDUCTOR COMPONENTS INDUSTRIES, LLC, Phoenix, AZ (US)

(72) Inventors: Paul Andre M. Decloedt, Wortegem-Petegem (BE); Jiri Daniel, Rajhrad (CZ); Pavel Horsky, Brno (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 243 days.

(21) Appl. No.: 15/601,177

(22) Filed: May 22, 2017

(65) Prior Publication Data

US 2017/0357582 A1 Dec. 14, 2017

Related U.S. Application Data

(60) Provisional application No. 62/348,323, filed on Jun. 10, 2016.

(51) Int. Cl.
| | |
|---|---|
| *G05B 23/02* | (2006.01) |
| *H05B 33/08* | (2006.01) |
| *G06F 12/08* | (2016.01) |
| *G05B 19/042* | (2006.01) |
| *H05B 37/02* | (2006.01) |
| *H04L 29/12* | (2006.01) |

(Continued)

(52) U.S. Cl.
CPC .......... *G06F 12/08* (2013.01); *G01R 31/2635* (2013.01); *G05B 19/0423* (2013.01); *G05B 19/0426* (2013.01); *G06F 12/0653* (2013.01); *G06F 13/387* (2013.01); *H04L 12/40032* (2013.01); *H04L 12/40169* (2013.01); *H04L 61/2038* (2013.01); *H05B 33/083* (2013.01); *H05B 33/0893* (2013.01); *H05B 37/0254* (2013.01)

(58) Field of Classification Search
CPC .... G06F 12/08; G06F 12/0653; G06F 13/387; G05B 19/0426; G05B 19/0423; H05B 37/0254; H05B 33/083; H05B 33/0893; H04L 61/2038; H04L 12/40032; H04L 12/40169; G01R 31/2635
See application file for complete search history.

(56) References Cited

U.S. PATENT DOCUMENTS

| | | |
|---|---|---|
| 6,392,558 B1 | 5/2002 | Schulmeyer et al. |
| 8,645,580 B2 | 2/2014 | Koudar |

(Continued)

*Primary Examiner* — Kalpit Parikh
(74) *Attorney, Agent, or Firm* — Atesa Legal PLLC

(57) ABSTRACT

An apparatus for auto addressing includes a communication bus interface configured to receive an address assignment request to assign an address to the apparatus. A functional connection is configured to activate a device connected to the apparatus. A detector is configured to measure a characteristic of the device and to compare the characteristic with a validation parameter. The characteristic depends on the functional connection. An address assignment circuit is configured to store the address in a memory of the apparatus in response to receiving the address assignment request at the apparatus, and the characteristic being validated with the validation parameter.

20 Claims, 9 Drawing Sheets

(51) Int. Cl.
    *G01R 31/26*     (2020.01)
    *G06F 12/06*     (2006.01)
    *G06F 13/38*     (2006.01)
    *H04L 12/40*     (2006.01)

(56) References Cited

U.S. PATENT DOCUMENTS

| | | | |
|---|---|---|---|
| 9,491,836 B2* | 11/2016 | Lys | H05B 37/0254 |
| 2004/0117537 A1 | 6/2004 | Marcel Vandensande | |
| 2011/0109228 A1* | 5/2011 | Shimomura | H05B 37/0245 |
| | | | 315/113 |
| 2012/0066356 A1* | 3/2012 | Nguyen | H04L 29/12254 |
| | | | 709/220 |
| 2014/0265636 A1* | 9/2014 | De Natale | H03K 5/1252 |
| | | | 307/117 |
| 2015/0204487 A1* | 7/2015 | Scapa | F21V 23/006 |
| | | | 362/222 |
| 2016/0318437 A1* | 11/2016 | Vilakathara | F21S 41/60 |

\* cited by examiner

AUTO ADDRESSING USING FUNCTIONAL CONNECTION

CROSS-REFERENCE TO RELATED APPLICATIONS

This application is a utility application claiming priority to U.S. Provisional Application Ser. No. 62/348,323 filed on Jun. 10, 2016 entitled "AUTO ADDRESSING METHOD USING FUNCTIONAL CONNECTION," the entirety of which is incorporated by reference herein.

FIELD

This disclosure relates generally to assigning an address to a networked module, and more specifically to automatically assigning an address to networked modules without requiring dedicated connections therebetween.

BACKGROUND

Systems that employing networked modules typically require each module to have a unique address for identification on a shared bus. One example of a networked system is a network of modules in an automotive system using a Controller Area Network (CAN) or a Local Interconnect Network (LIN) bus.

One method used to assign the address to each module is to configure each module to have a unique address prior to installing each module in the system. This approach requires a significant inventory of uniquely address parts and makes repairs with substituted parts needlessly complex. Another method permits the installation of all the modules in the networked system prior to the address being assigned. With this method, an auto addressing wire or special wire is used to provide a special communication bus through each module. Alternatively, a larger connector is used with additional wires on the shared bus to provide unique addresses to be assigned to each module.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods described herein provide for address assignment based on a module's position in a network without the requirement for a preprogrammed address or special connections between a network controller and each module. Successive activation of functional connections, (e.g., connections used for system operation subsequent to address assignment), is used to uniquely determine a module's position in the system relative to other modules. This disclosure describes various embodiments of lighting systems having a Light Control Unit (LCU) and a plurality of pixel controllers controlling a plurality of serially connected LEDs (e.g., strings). However, the auto addressing methods described herein are considered applicable to other control systems with serial LED strings replaced by LEDs connected in parallel or by devices, other than LEDs, that are selectively powered by a functional connection.

Figure 1:
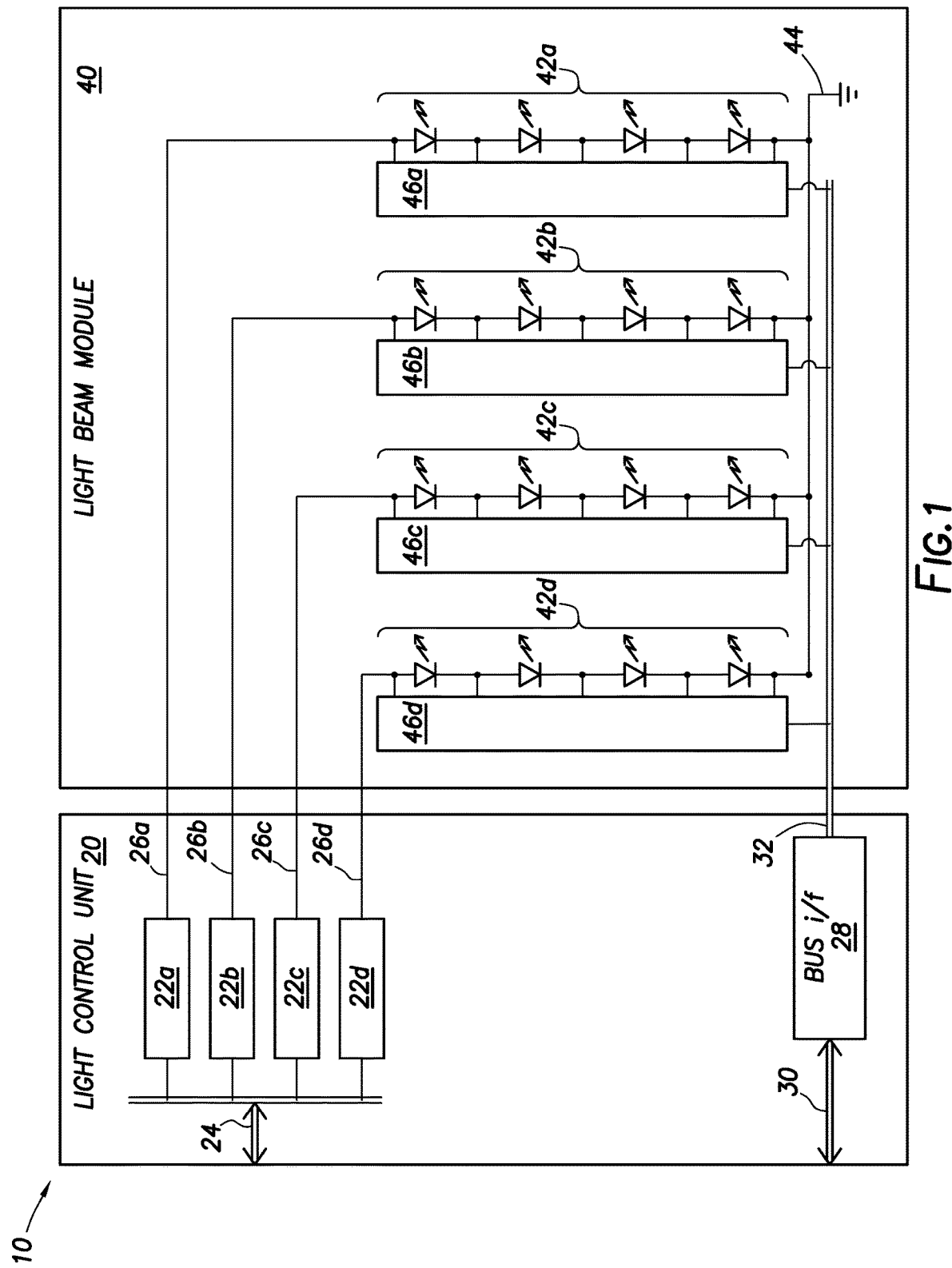
FIG. 1 is a schematic view of an embodiment of a lighting system.

Referring to FIG. 1, an embodiment 10 of a lighting system includes an LCU 20 having a plurality of LED drivers 22a, 22b, 22c and 22d (generally 22). In various embodiments, the LED drivers 22 each include a selectable current source to provide a current supply to an LED. The LED drivers are activated and deactivated by control signals on a control bus 24. In one example, a signal on the control bus 24 connects a current source to one of the LED drivers 22 by activating a switch between the current source and load. Each of the LED drivers 22a, 22b, 22c and 22d provide selectable current to LEDs through respective functional connections 26a, 26b, 26c and 26d (generally 26).

The LCU 20 further includes a bus interface 28 to transmit and receive signals between a system bus 30 and a communication bus 32. In one embodiment, the control bus 24 and the system bus 30 connect to a CAN bus and communicate with a microcomputer also connected to the CAN bus. In another embodiment, a microcomputer (not shown) is included in the LCU and communicates directly with the LED drivers 22 and the bus interface 28, while the bus interface 28 communicates with a CAN bus over the system bus 30.

In various embodiments, the bus interface 28 communicates with the communications bus 32 using a Universal Asynchronous Receiver/Transmitter (UART) protocol and Low Voltage Differential Signal (LVDS) formatted signals. It should be understood that other protocols and physical layers may be used to communicate over the communication bus 32, without departing from the scope and spirit of this disclosure. In various embodiments, the LCU 20 communicates with a light beam module 40 over a plurality of functional connections 26 and the communication bus 32. The light beam module 40 includes a plurality of LED strings 42a, 42b, 42c and 42d (generally 42) connected between respective functional connections 26a, 26b, 26c and 26d and a ground 44. In other embodiments, the ground 44 is replaced with another fixed voltage with a potential sufficient to allow the LED strings 42 to be forward biased by the LED drivers 22. Each of the LED strings 42 includes a plurality of LEDs connected in series. Each of the LED strings 42a, 42b, 42c and 42d are connected in parallel with a respective pixel controller 46a, 46b, 46c and 46d (generally 46). Each pixel controller 46 is connected to the communication bus 32.

In some embodiments, the LEDs of the LED strings 42 are physically arranged to form a two-dimensional (2D) pattern of illumination when the LEDs are activated. In one non-limiting example, a 2D pattern of illumination is formed by a headlamp or front-lighting system of an automobile. By selectively controlling the illumination, (including full or zero illumination) of the LEDs a headlamp is controlled to minimize glare imposed on an approaching vehicle. In another example, the intensity of the LEDs is controlled by changing the current flowing through each LED in response to detecting an approaching vehicle. In various examples, the approaching vehicle is detected by measuring the illumination from that approaching vehicle by a camera.

Figure 2:
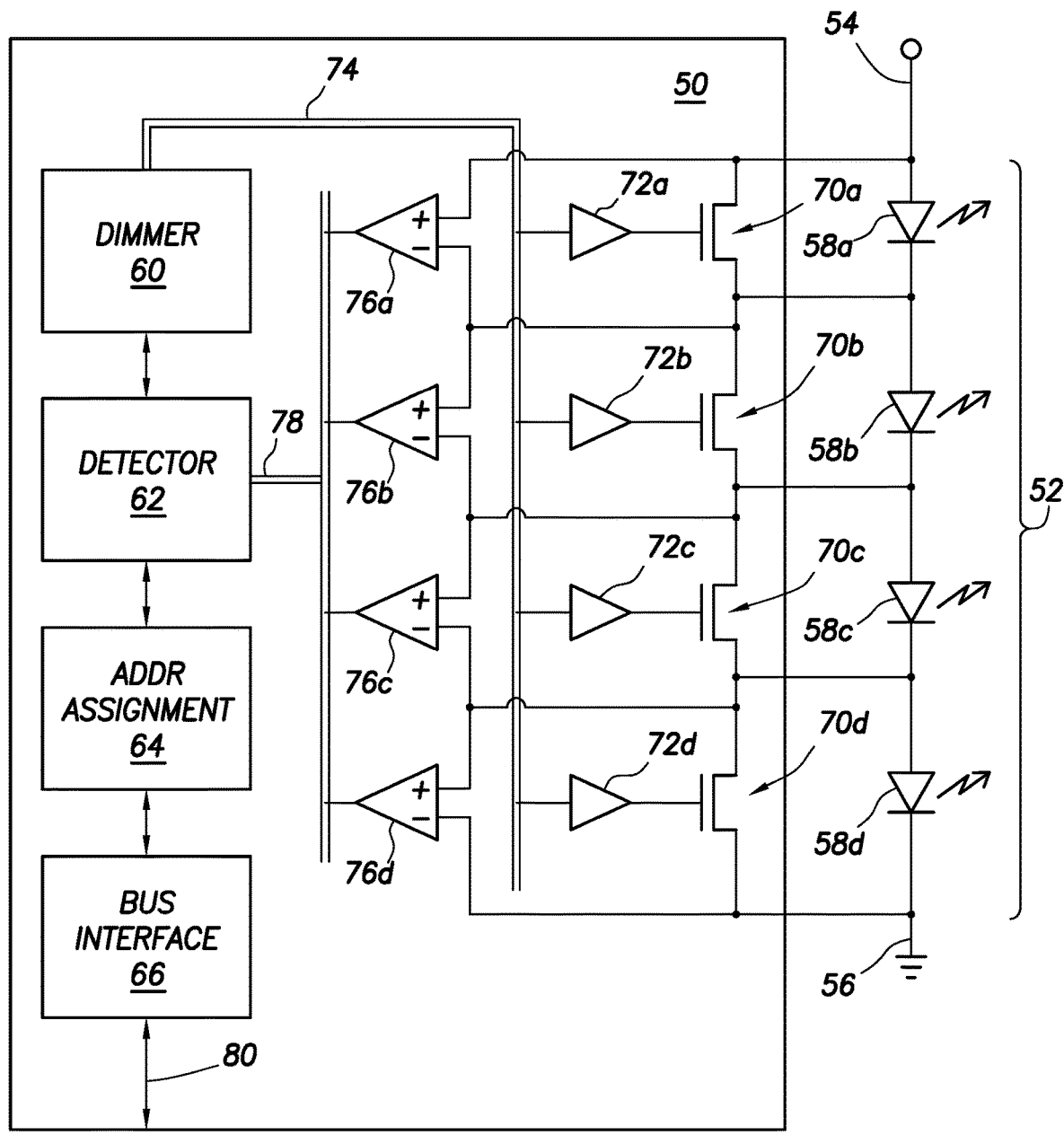
FIG. 2 is a schematic view of a pixel controller, in accordance with an embodiment of the present disclosure.

A pixel controller 50 is illustrated in FIG. 2, with continued reference to FIG. 1. The pixel controller 50 is connected in parallel with an LED string 52. The LED string 52 is connected between a functional connection 54 providing a gated supply of current and a ground 56. In some embodiments, the ground 56 is replaced with a fixed voltage reference sufficiently lower than a voltage provided by the functional connection 54 such that the LEDs in the LED string can be forward biased. The LED string 52 includes a plurality of LEDs 58a, 58b, 58c and 58d (generally 58). In another embodiment, the LEDs 58 are connected with an opposite polarity to that shown in FIG. 2 (e.g., the anode and cathode of each of the LEDs 58 are transposed and the ground 56 is replaced with a potential higher than the potential of an active functional connection.

In various embodiments, the pixel controller 50 includes a dimmer module 60, a detector module 62, an address assignment module 64 and a bus interface 66. Each of the LEDs 58a, 58b, 58c and 58d in the LED string 52 are connected in parallel with a respective transistor 70a, 70b, 70c and 70d (generally 70), configured to shunt at least part of a bias current flowing from the functional connection 54 to the ground 56. For example, when the dimmer module 60 is requested to reduce the illumination from LED 58c by 30%, (by a request received from the communication port 80 and passed to the dimmer module 60), the dimmer module 60 activates the transistor 70c to partially conduct current by establishing a specific gate voltage on 70c. In another embodiment, Pulse Width Modulation (PWM) dimming is used to dim the LED. For example, the transistor 70c would be active 70% of the time and the LED 58c would be active 30% of the time. PWM switching is performed at a sufficiently high frequency to minimize visual flicker of the LEDs. Accordingly, the bias current flowing from the functional connection 54 to the ground 56 flows 100% through LED 58a, then 100% through LED 58b, then 70% through LED 58c (with the remaining 30% through transistor 70c), and then 100% through LED 59d to the ground 56. In some embodiments, the transistors 70 are N-Channel FETs, although other transistors types, capable of shunting a sufficient amount of current from a respective LED, are considered within the scope and spirit of this disclosure. In some embodiments, each of the transistors 70a, 70b, 70c and 70d have gates that are driven by respective level shifting pre-drivers 72a, 72b, 72c and 72d (generally 72). The pre-drivers 72 are driven by the dimmer module 60 over a bus 74.

Each of the LEDs 58a, 58b, 58c and 58d are also connected in parallel with respective differential amplifiers 76a, 76b, 76c and 76d (generally 76). Each of the differential amplifiers 76 communicates with the detector module 62 over the bus 78. The differential amplifiers 76 measure a voltage drop across a respective LED 58. In another embodiment, the differential amplifiers 76 are replaced with comparators. In one embodiment, the detector module 62 summates the output from each differential amplifier 76 to determine a total voltage drop across the LED string 52. In another embodiment, each output from the differential amplifiers 76 is stored in the detector module 62 to determine one or more characteristics of the LEDs 58 over time to diagnose LED behavior. In one example, a failed LED from the LED string 52 is determined to assist with repairing the light beam module 40 after installation. In another embodiment, the maximum voltage (e.g., across the entire LED string 52) is measured directly without summating the voltages across each of the LEDs 58.

In one embodiment, diagnostic information collected at the detector module 62 is sent to the LCU 20 by the bus interface 66 over the communication port 80 connected to the communication bus 32. The LCU 20 then transfers the diagnostic information to a user through the system bus 30. Similar to the bus interface 28 in the LCU 20, the bus interface 66 in the pixel controller 50 communicates over the communication port 80 to the communications bus 32 using a Universal Asynchronous Receiver/Transmitter (UART) protocol and Low Voltage Differential Signal (LVDS) formatted signals. It should be understood that other protocols and physical layers may be used to communicate over the communication bus 32, without departing from the scope and spirit of this disclosure.

When the lighting system 10 of FIG. 1 is utilized in its intended operating environment for controlling a pattern of illumination, the functional connections 26 activate the LED strings 42, and the communication bus 32 transfers requests between the LCU 20 and the pixel controllers 46. Similarly, the embodiment 50 of the pixel controller of FIG. 2 uses the function connection 54 to activate the LED string 52 and requests are send and received at the communication port. In one embodiment of an auto addressing method, the pixel controller 50 is put in a special mode to receive an address assignment request at the address assignment module 64. In various embodiments, the address assignment request also includes a validation parameter, (e.g., an allowable voltage across the LED string 52). In other embodiments, the validation parameter is separate from the address assignment request (e.g., the parameter is programmed into the pixel controller or sent by a separate communication over the communication bus 32). The detector module 62 measures the voltage across the LED string 52 with the differential amplifiers 76 and passes this value to the address assignment module 64 for comparison with the validation parameter. If the measured voltage across the LED string 52 (e.g., 40V) is greater than, or equal to, the validation parameter (e.g., 30V), then an address is assigned to the pixel controller 50. The measured voltage and value of the validation parameter is presented in this example for purposes of illustration and should not be construed as limiting this disclosure to a specific numerical values, as the values will vary depending upon the number and type of LEDs in an LED string.

In one embodiment, the address assigned to the pixel controller 50 is a unique address included in the address assignment request. In one embodiment, the assigned address is stored in a memory (not shown) in the address assignment module 64. In another embodiment, the address is stored in a memory (e.g. a non-volatile Flash, OTP or EEPROM memory) in the pixel controller 50. It should be understood that the dimmer module 60, the detector module 62, the address assignment module 64 and the bus interface 66 are shown as functional blocks in FIG. 2 but may be physically combined in various combinations in other embodiments. In other embodiments, in addition to the memory for storing the assigned address, the pixel controller 50 includes an OTP memory, which can be programmed to have a pre-assigned address that prevents the auto assignment process. In another embodiment, a series of resistors are used to pre-define the address, whose value will be overwritten by the auto addressing process. For example, the address assigned by auto addressing activates a buffer for each address bit that overcomes the current from each respective resistor.

Figure 3:
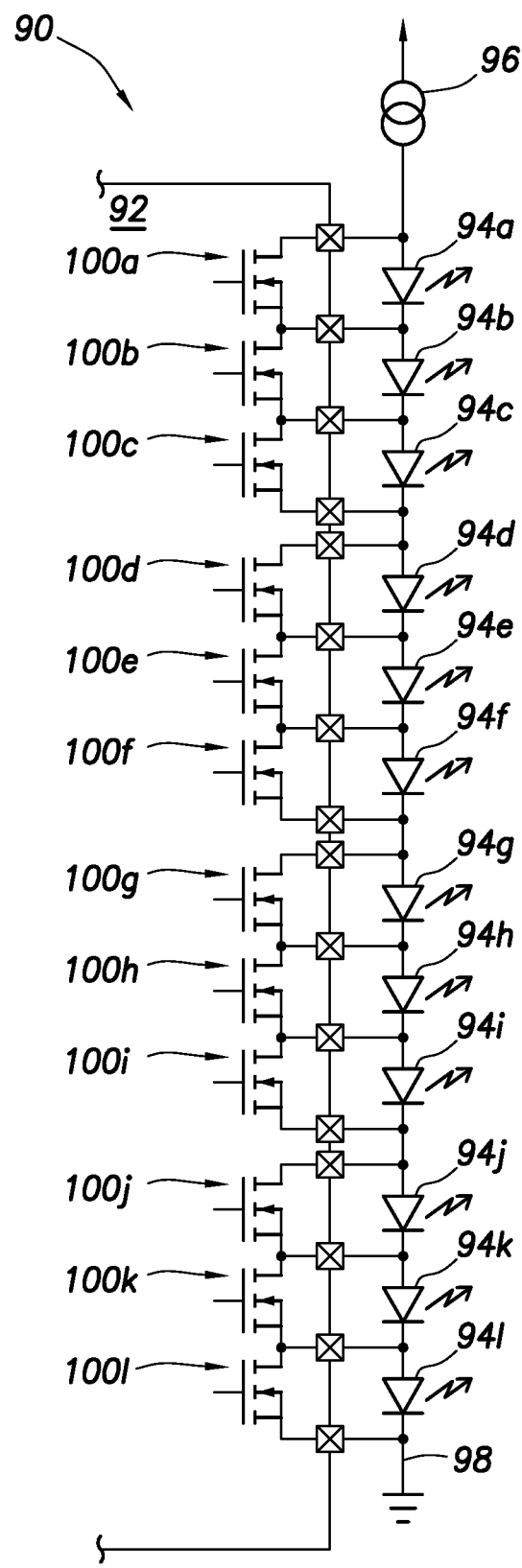
FIG. 3 is a schematic view of a pixel controller connected to a Light Emitting Diode (LED) string, configured with one LED per pixel.

FIG. 3 through FIG. 8 illustrate various embodiments of a pixel controllers and LED strings with different combinations of parallel connections therebetween. FIG. 3 shows an embodiment 90 of a lighting system including a pixel controller 92 connected to an LED string of twelve serially connected LEDs 94a, 94b, 94c, 94d, 94e, 94f, 94g, 94h, 94i, 94j, 94k and 94l (generally 94). The LEDs 94 are connected between a gated current source 96, (by the functional connection), and to a ground 98. Each of the transistors 100a, 100b, 100c, 100d, 100e, 100f, 100g, 100h, 100i, 100j, 100k and 100l (generally 100) of the pixel controller 92 are connected in parallel to a respective LED 94. The embodiments in FIG. 3 to FIG. 8 show a configuration of four groups of 3 transistors, with a double connection between LEDs 94c and 94d, LEDs 94f and 94g, and LEDs 94i and 94j. In other embodiments, each of the double connections is replaced with a single connection. In other embodiments, a different number of switches in a group, a different number of groups, or both are used.

Figure 4:
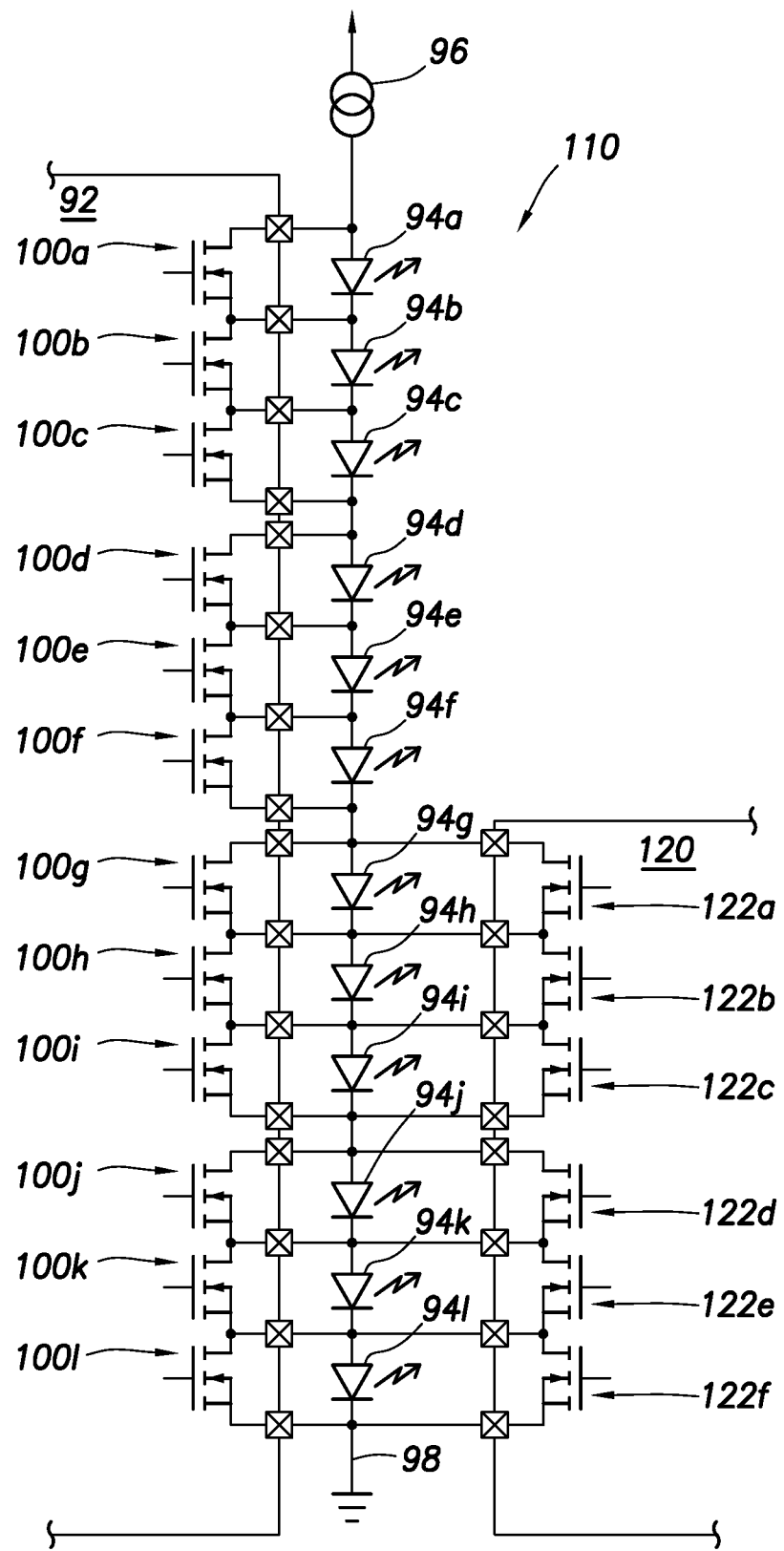
FIG. 4 is a schematic view of two pixel controllers connected to an LED string.

FIG. 4 shows an embodiment 110 of a lighting system including the pixel controller 92 and LEDs 94 from FIG. 3, in addition to a second pixel controller 120 connected to a subset of the LEDs 94. Specifically, the second pixel controller 120 includes six transistors 122a, 122b, 122c, 122d, 122e and 122f (generally 122) connected to respective LEDs 94g, 94h, 94i, 94j, 94k and 94l. During address assignment, all the pixel controllers sharing the communication bus 32 enter a special mode to receive an address assignment request. The functional connection that connects LEDs 94 to the gated current source 96 is activated.

In one non-limiting example, a validation parameter is included with an address assignment request received by each of the pixel controllers on the communication bus 32, where the value of the validation parameter is 30V. In one example, the detected voltage across the LED string connected to the pixel controller 92 (e.g., across LEDs 94a to 94l) is 40V, thus greater than or equal to 30V. Accordingly, an address included with the address assignment request is stored in the pixel controller 92. In contrast, the detected voltage across the LED string connected to the second pixel controller 120 (e.g., across LEDs 94g to 94l) is 20V. Accordingly, no address is assigned to the second pixel controller 120, until a subsequent address assignment request is received over the communication bus 32 with a validation parameter of 10V, for example. In one example, the subsequent address assignment request is communicated over the communication bus 32 after each of the functional connections are activated in succession for the first address assignment request.

During this subsequent pass of address assignment, the second address included with the second address assignment request is stored in the second pixel controller 120 because the detected voltage of 20V exceeds the validation parameter of 10V. The other pixel controllers connected to the other LED strings will detect zero volts become the other LED strings are not activated by a respective functional connection. Restated, only one functional connection, (and thus only one LED string) is active at any given time.

In one embodiment, when multiple pixel controllers are anticipated to share an LED string, the address assignment request uses the highest validation parameter first, and then uses validation parameters with lower values in subsequent passes. The pixel controller will disable further address storage once a valid address is received assigned and validated against a detected LED string voltage, to prevent the address from being overwritten by a subsequent address. In another embodiment, the detected voltage across the LED string is compared to be within a certain tolerance (greater than or less than) the validation parameter, without requiring the pixel controller to disable further address storage updates, for example a range of 35V to 45V for the pixel controller 92 and a range of 15V to 25V for the second pixel controller 120.

Figure 5:
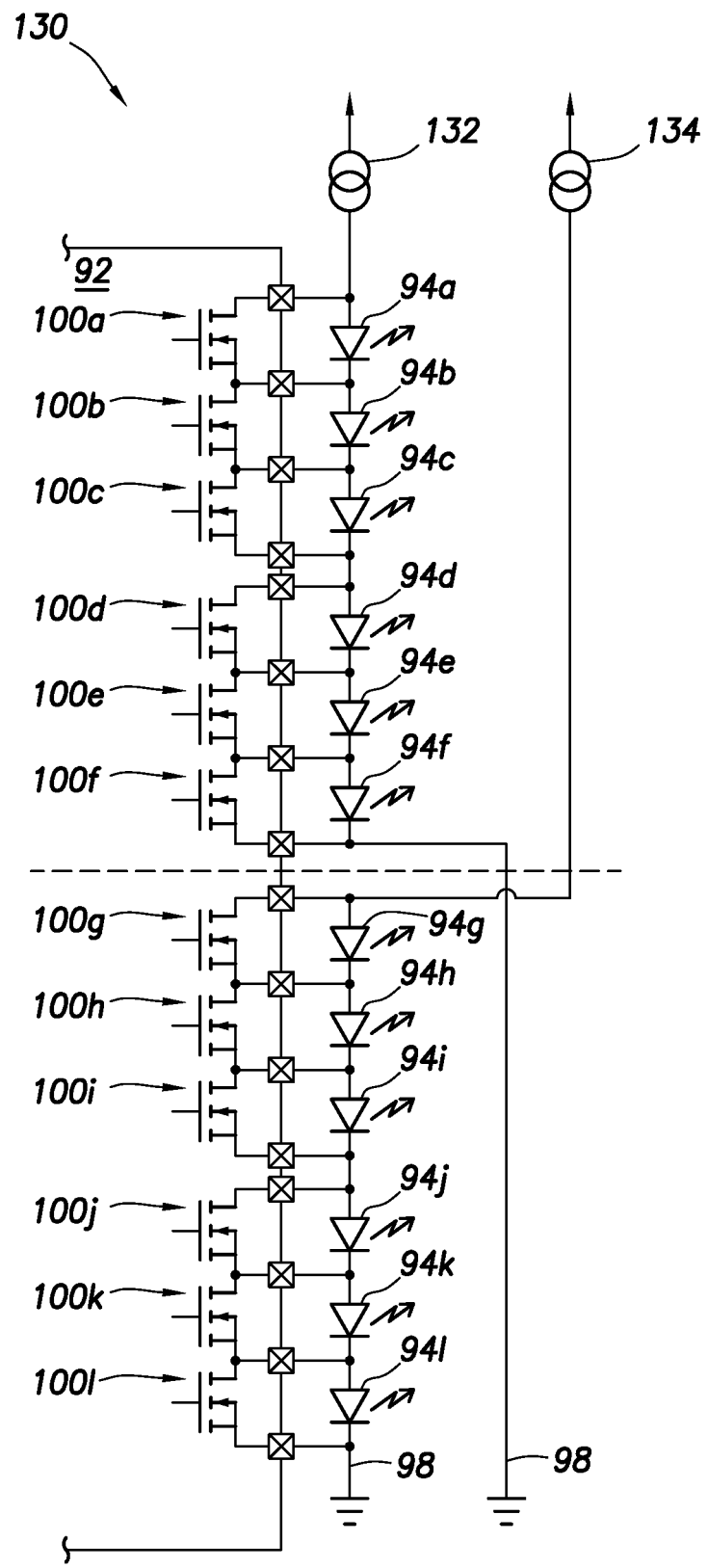
FIG. 5 is a schematic view of a pixel controller connected to two LED strings.

FIG. 5 shows an embodiment 130 of a lighting system similar to the embodiment 90 of FIG. 3 but with one pixel controller 92 shared with two LED strings. Specifically the first LED string formed by LEDs 94a to 94f is connected between a gated current source 132 and a ground 98. The second LED string formed by LEDs 94g to 94l is connected between a gated current source 134 and a ground 98. In one embodiment, following receipt of an address assignment request by the pixel controller 92, the first LED string is activated by the functional connection to the gated current source 132. The detected voltage drop across the first LED string is compared to the value of the validation parameter and an address is provisionally stored if the detected voltage is equal to, or greater than the validation parameter. Subsequently, the second LED string is activated by the functional connection to the gated current source 134. The detected voltage drop across the second LED string is compared to the value of the validation parameter and an address is stored if the detected voltage for both the first string and the second string is equal to, or greater than the validation parameter. Other variations to the method of address assignment are possible with the embodiment of FIG. 5, including summating a detected voltage across the first LED string and subsequently adding the summated voltage to a detected voltage across the second LED string, once the second LED string is activated, followed by a comparison with a value of the validation parameter consistent with a string including all LEDs 94a to 94l. In another embodiment, an address is assigned to the pixel controller 92 based on the activation of only one current source (e.g., 132) and a comparison of the detected voltage across only the first string with the value of the validation parameter.

Figure 6:
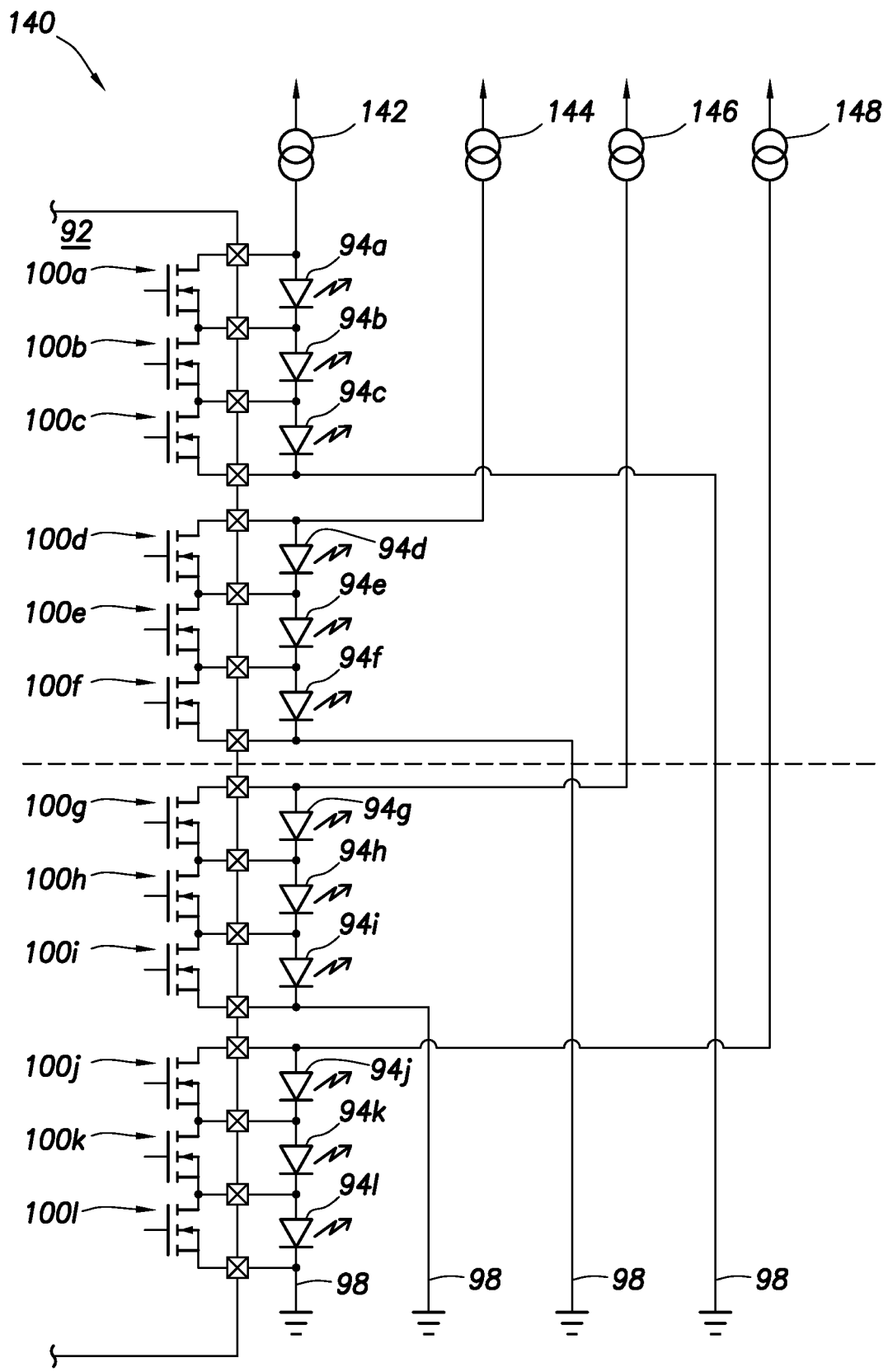
FIG. 6 is a schematic view of a pixel controller connected to four LED strings.

FIG. 6 shows an embodiment 140 of a lighting system similar to the embodiment 130 of FIG. 5 but with one pixel controller 92 shared with four LED strings, rather than two. Specifically, the first LED string formed by LEDs 94a to 94c is connected between a gated current source 142 and a ground 98. The second LED string formed by LEDs 94d to 94f is connected between a gated current source 144 and a ground 98. The third LED string formed by LEDs 94g to 94i is connected between a gated current source 146 and a ground 98. The fourth LED string formed by LEDs 94j to 94l is connected between a gated current source 148 and a ground 98. The methods for address assignment are similar to those described for the embodiment 130 of FIG. 5. In various embodiments, any one of the four current sources 142, 144, 146 and 148 are activated and a voltage drop across one of the four LED strings is compared with the value of the validation parameter to assign an address to the pixel controller 92 without iteration. For example, an anode of a respective diode is connected to each drain of transistors 100a, 100d, 100f and 100j. The four diodes have a common cathode. Accordingly, the voltage on the common cathode is the maximum of the voltage drop across each of the four LED strings.

Figure 7:
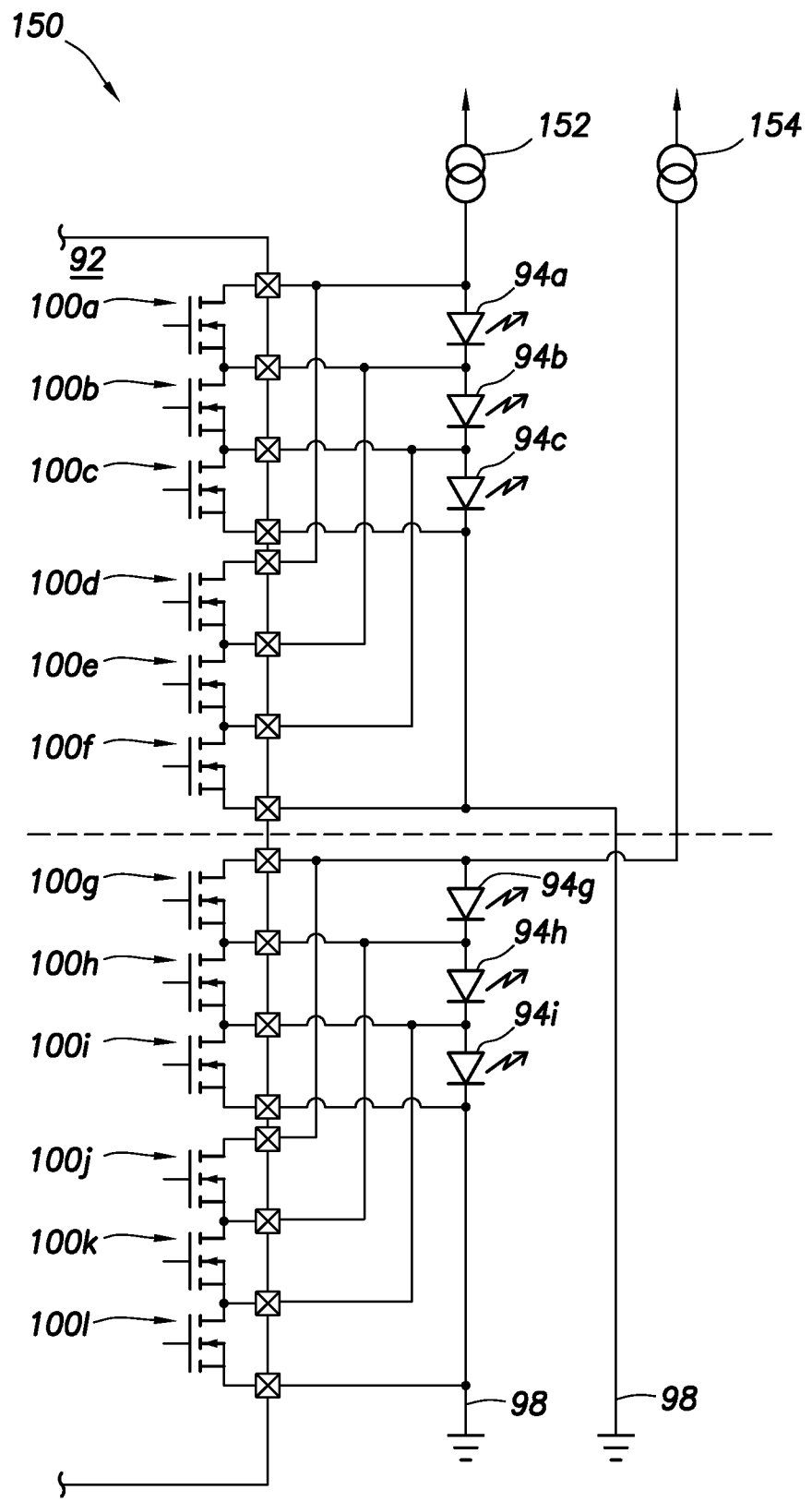
FIG. 7 is a schematic view of a pixel controller connected to two LED strings, and configured to supply twice the current to each LED compared to the configuration of FIG. 5.

FIG. 7 shows an embodiment 150 of a lighting system similar to the embodiment 130 of FIG. 5 but configured to double the available current and controllable range to each of the LEDs 94. Specifically, a first LED string includes LEDs 94a to 94c, connected between a gated current source 152 (through a first functional connection), and a ground 98. A second LED string includes LEDs 94g to 94i, connected between a gated current source 154 (through a second functional connection), and a ground 98. In contrast to the embodiment 130 of FIG. 5, the embodiment 150 is configured with two transistors in parallel with each LED, and current sources 152 and 154 supplying twice the current of current sources 132 and 134 respectively (from FIG. 5). Specifically, the LED 94a is configured to be shunted by transistors 100a and 100d under control of a dimmer module 60 (see FIG. 2). Similarly, LEDs 94b, 94c 94g, 94h and 94i are configured to be shunted by transistors 100b and 100e, 100c and 100f, 100g and 100j, 100h and 100k, 100i and 100l respectively. The methods for address assignment of embodiment 150 are similar to those described for embodiment 130 of FIG. 5 with changes to the value of the validation parameter to account for changes a voltage drop across the respective LED strings.

Figure 8:
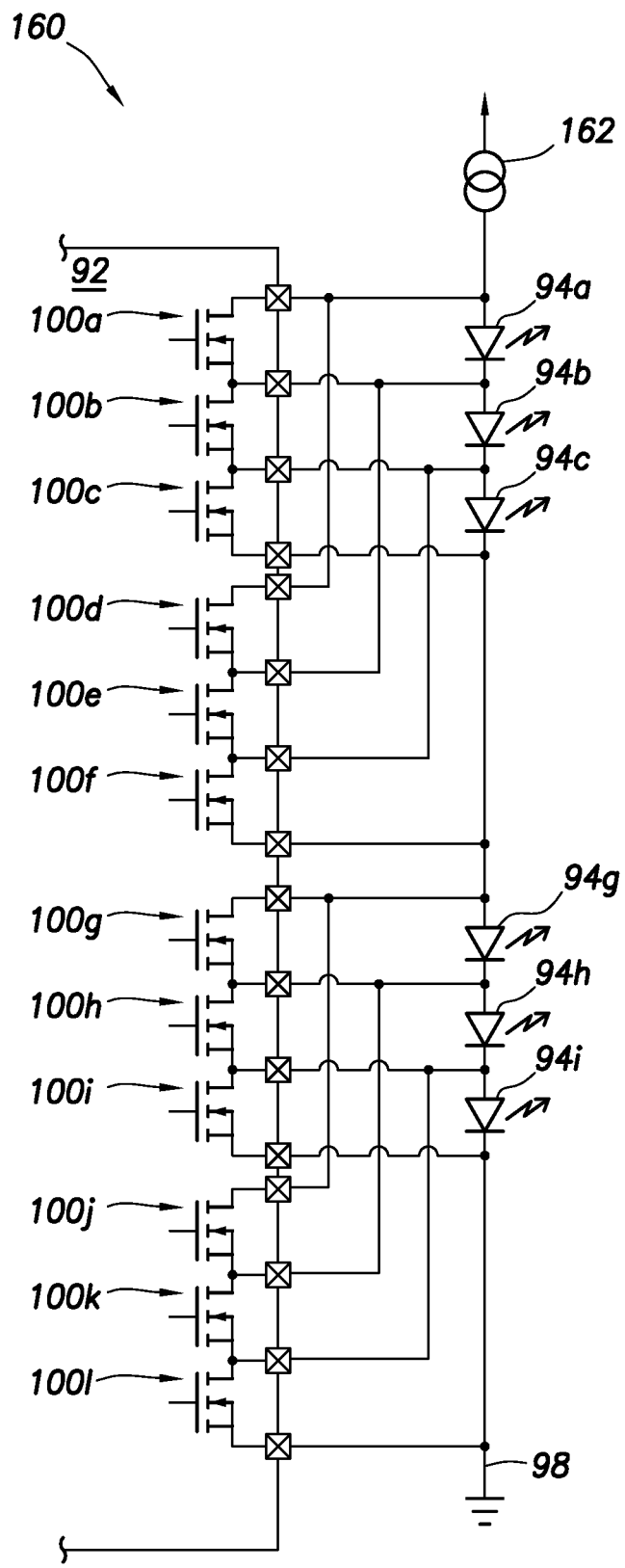
FIG. 8 is a schematic view of a pixel controller connected to one LED string, and configured to supply twice the current to each LED compared to the configuration of FIG. 3.

FIG. 8 shows an embodiment 160 of a lighting system similar to the embodiment 90 of FIG. 3 with the modifications that FIG. 7 applies to FIG. 5. The methods for address assignment of the embodiment 160 are similar to those described for the embodiment 90 of FIG. 3. The various embodiments described in FIG. 3 to FIG. 8 illustrate various combinations of the pixel controller and LED strings, although other combinations are envisioned within the scope and spirit of this disclosure.

Figure 9:
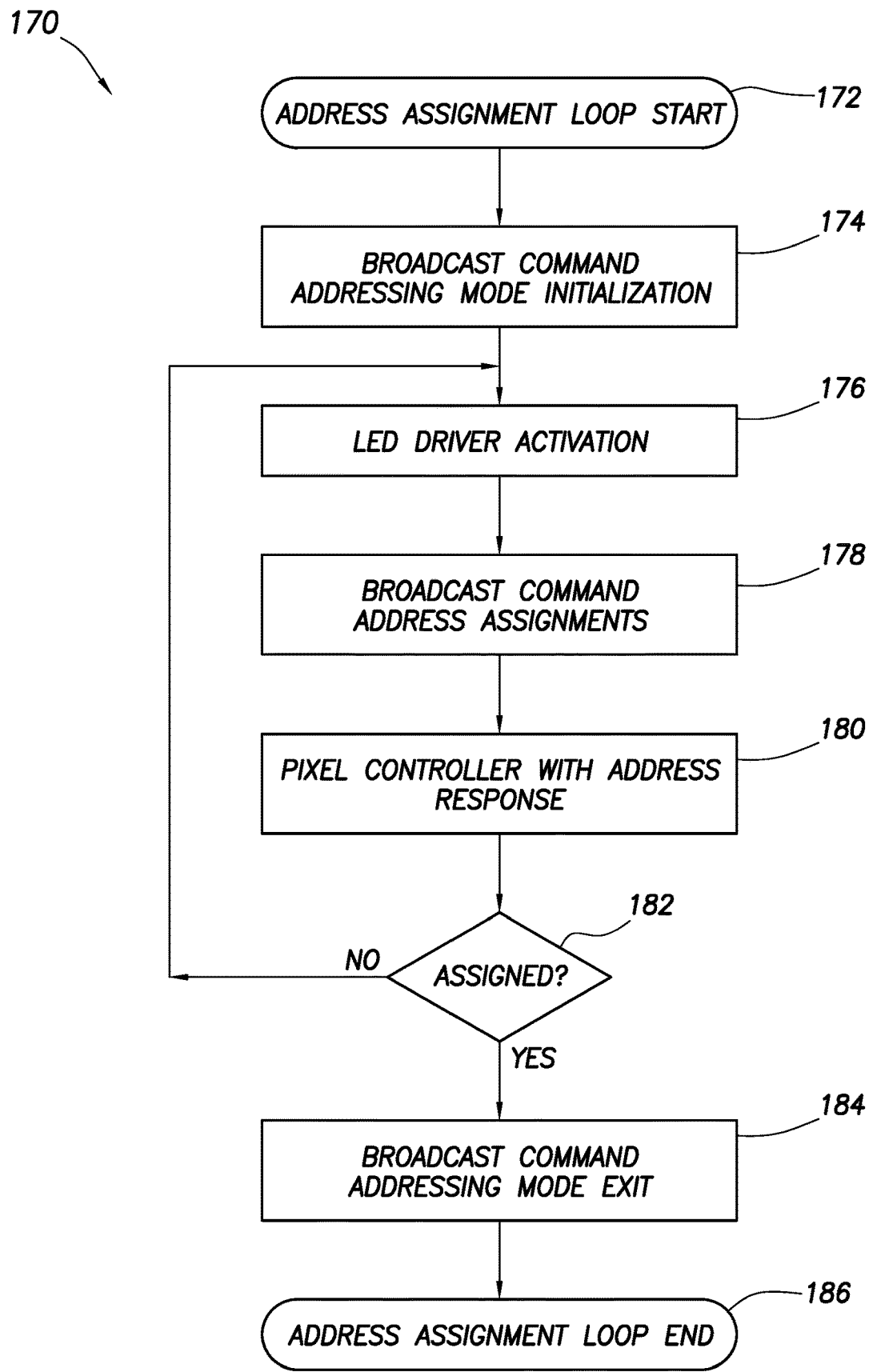
FIG. 9 is a flowchart representation of a method for auto addressing using functional connections, in accordance with an embodiment of the present disclosure.

FIG. 9 shows a method for auto addressing according to an embodiment 170 of the present disclosure. Referring to FIG. 1, FIG. 2 and FIG. 9, the method begins at 172. At 174, an addressing mode initialization is performed by the LCU 20 broadcasting a command over the communication bus 32 to each of the pixel controllers. Specifically, a pixel controller 50 receives an address initiation request at the communication port 80 to configure the pixel controller 50 to be responsive to an address assignment request.

At 176, a LED driver (e.g. 22a) is activated to apply a bias current to one of the LED strings (e.g. 42a) over a functional connection (e.g. 26a). At 178, the LCU 20 broadcasts a command to each of the pixel controllers to conditionally perform address assignment. Specifically, an address assignment request is received at the communication port 80 of the pixel controller 50 including a validation parameter and an address. If a characteristic of the LED string (e.g., an LED string voltage as measured by the detector 62) is validated against the validation parameter, then the address received with the address assignment request is stored in the pixel controller.

In some embodiments at 180, the pixel controller responds to the LCU 20 to confirm successful address assignment. At 182, if functional connections have not been activated, then the method returns to 176 when the present functional connection is deactivated, and the next functional connection is activated. At 182, if all the functional connections have been activated in succession, then the method continues to 184. At 184 the LCU 20 broadcasts a command to exit the address assignment mode. Specifically, an address termination request is received at the communication port 80 of the pixel controller 50 to configure the pixel controller 50 to receive a dimming request (e.g., a request for the dimmer 60 to activate one or more of the transistors 70 to shunt current from the LEDs 58 and thereby control the photonic emissions or illumination from the LEDs 58. At 186, the method terminates.

As will be appreciated, embodiments as disclosed include at least the following. In one embodiment, a method for auto addressing comprises receiving an address initiation request at a communication port of a controller. The address initiation request configures the controller to enter an address assignment mode. A functional connection to a device connected to the controller is activated. The address assignment request is received at the communication port. A characteristic of the device is validated with the validation parameter. The characteristic depends on the functional connection. An address is assigned to the controller in response to validating the characteristic. An address termination request is received at the communication port. The address termination request configures the controller to exit the address assignment mode.

Alternative embodiments of the method for auto addressing include one or the following features, or any combination thereof. Validating the characteristic of the device includes measuring an LED voltage across an LED string and comparing the LED voltage to the validation parameter, the characteristic being validated when the LED voltage is equal to, or greater than, the validation parameter, wherein the validation parameter is a validation voltage. Assigning the address to the controller includes storing the address included in the address assignment request in a memory of the controller. The controller transmits an address confirmation at the communication port in response to storing the address. The controller generates the address in response to the characteristic being validated, and transmits the address at the communication port for confirmation by a second controller connected thereto, that the address assignment process was successful. An address termination request is received at the communication port, the address termination request configuring the controller to exit the address assignment mode. The controller is one of a plurality of controllers sharing the communication port, each of the controllers being connected to a respective LED string, and a respective functional connection for each of the LED strings activated in succession. Two or more controllers are connected to a same LED string, each controller having a different value of the validation parameter. The device includes at least one Light Emitting Diode (LED) and an average current of one of the at least one LEDs is reduced in response to a dimming request received at the communication port. The average LED current flowing through one of the LEDs is reduced by shunting at least part of the average LED current through a transistor connected in parallel with the one LED.

In another embodiment, an apparatus for auto addressing comprises a communication bus interface configured to receive an address assignment request to assign an address to the apparatus. A functional connection is configured to activate a device connected to the apparatus. A detector is configured to measure a characteristic of the device and to compare the characteristic with a validation parameter. The characteristic depends on the functional connection. An address assignment circuit is configured to store the address in a memory of the apparatus in response to receiving the address assignment request at the apparatus, and the characteristic being validated with the validation parameter. Alternative embodiments of the apparatus for auto addressing include one of the following features, or any combination thereof. The communication bus interface receives the address assignment request formatted as a Low Voltage Differential Signal and decodes the address assignment request with a Universal Asynchronous Receiver Transmitter circuit. The detector includes a diagnostics circuit configured to monitor a characteristic of the device. A plurality of transistors are connected in series, each transistor connected in parallel with a respective one of a plurality of LEDs and configured to shunt at least a portion of an average current from the respective one of the LEDs in response to a dimming request from a dimmer. The dimmer is configured to reduce an LED current of at least one of a plurality of LEDs to vary a lighting intensity in at least one of an azimuth angle and an elevation angle. The lighting intensity is reduced in response to a light detected from at least one of the azimuth angle and the elevation angle.

In another embodiment, a pixel controller comprises a communication bus interface configured to receive an address assignment request to assign an address to the pixel controller. A functional connection is configured to supply a bias current to a Light Emitting Diode (LED) string having a plurality of LEDs connected in series. The LED string is connected to the pixel controller. A detector is configured to measure an LED string voltage across the LED string, and to compare the LED string voltage to a validation parameter received with the address assignment request. An address assignment circuit is configured to store the address in a memory of the pixel controller when the LED voltage is validated with the validation parameter.

Alternative embodiments of the pixel controller include one of the following features, or any combination thereof. The communication bus interface receives the address assignment request formatted as a Low Voltage Differential Signal and decodes the address assignment request with a Universal Asynchronous Receiver Transmitter circuit. A dimmer is configured to reduce an LED current through one of the plurality of LEDs by shunting at least part of the bias current with a transistor connected in parallel with the LED. A plurality of transistors is connected in series, and each transistor is connected in parallel with a respective one of the plurality of LEDs and configured to shunt at least a portion of the bias current from the respective LED in response to a dimming request by the dimmer.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for auto addressing comprising:
   receiving an address initiation request at a communication port of a controller, the address initiation request configuring the controller to enter an address assignment mode;
   activating a functional connection to a device connected to the controller by supplying a current through the functional connection connected in series with the device;
   receiving an address assignment request at the communication port;
   determining a characteristic of the device with the controller by measuring a voltage across the device, wherein the characteristic is a luminescence of the device;
   validating the characteristic of the device with a validation parameter, the characteristic enabled by the functional connection; and
   assigning an address to the controller in response to validating the characteristic of the device, wherein validating the characteristic of the device comprises the voltage across the device having a first magnitude being greater than, or equal to, a second magnitude of the validation parameter.

2. The method of claim 1 wherein validating the characteristic of the device includes measuring an LED voltage across an LED string and comparing the LED voltage to the validation parameter, the characteristic being validated when the LED voltage is equal to, or greater than, the validation parameter, wherein the validation parameter is a validation voltage.

3. The method of claim 1 wherein assigning the address to the controller includes storing the address included in the address assignment request in a memory of the controller.

4. The method of claim 3 wherein the controller transmits an address confirmation at the communication port in response to storing the address.

5. The method of claim 1 wherein the controller generates the address in response to the characteristic being validated, and transmits the address at the communication port for confirmation by a second controller connected thereto, that the address assignment was successful.

6. The method of claim 1 further comprising receiving an address termination request at the communication port, the address termination request configuring the controller to exit the address assignment mode.

7. The method of claim 1 wherein the controller is one of a plurality of controllers sharing the communication port, each of the controllers being connected to a respective LED string, and a respective functional connection for each of the LED strings activated in succession.

8. The method of claim 7 wherein two or more controllers are connected to a same LED string, each controller having a different value of the validation parameter.

9. The method of claim 1 wherein the device includes at least one Light Emitting Diode (LED) and an average LED current of one of the at least one LEDs is reduced in response to a dimming request received at the communication port.

10. The method of claim 9 wherein the average LED current flowing through one of the LEDs is reduced by shunting at least part of the average LED current through a transistor connected in parallel with the one LED.

11. An apparatus for auto addressing comprising:
    a communication bus interface configured to receive an address assignment request to assign an address to a device;
    a functional connection configured to activate the device by supplying a current to the device;
    a detector configured to measure a characteristic of the device by measuring a voltage across the device, wherein the characteristic is a luminescence of the device, and to compare the characteristic of the device with a validation parameter, the characteristic of the device enabled by the functional connection; and an address assignment circuit configured to store the address in a memory of the apparatus in response to receiving the address assignment request at the apparatus, and the characteristic of the device being validated with the validation parameter, wherein the characteristic of the device is validated by a first magnitude of the voltage across the device being greater than, or equal to, a second magnitude of the validation parameter.

12. The apparatus of claim 11 wherein the communication bus interface receives the address assignment request formatted as a Low Voltage Differential Signal and decodes the address assignment request with a Universal Asynchronous Receiver Transmitter circuit.

13. The apparatus of claim 11 wherein the detector includes a diagnostics circuit configured to monitor a characteristic of the device.

14. The apparatus of claim 11 further comprising a plurality of transistors connected in series, each transistor connected in parallel with a respective one of a plurality of LEDs and configured to shunt at least a portion of an average current from the respective one of the LEDs in response to a dimming request from a dimmer.

15. The apparatus of claim 11 further comprising a dimmer configured to reduce an LED current of at least one of a plurality of LEDs to vary a lighting intensity in at least one of an azimuth angle and an elevation angle.

16. The apparatus of claim 15 wherein the lighting intensity is reduced in response to a light detected from at least one of the azimuth angle and the elevation angle.

17. A pixel controller comprising:
a communication bus interface configured to receive an address assignment request to assign an address to the pixel controller;
a functional connection configured to supply a bias current to a Light Emitting Diode (LED) string having a plurality of LEDs connected in series, the LED string connected to the pixel controller;
a detector configured to measure an LED string voltage across the LED string, wherein the LED string voltage is proportional to a luminescence of the device, and to compare the LED string voltage to a validation parameter received with the address assignment request; and
an address assignment circuit configured to store the address in a memory of the pixel controller when the LED string voltage is validated with the validation parameter, wherein the LED string voltage is validated in response to the LED string voltage being greater than, or equal to, a voltage of the validation parameter.

18. The apparatus of claim 17 wherein the communication bus interface receives the address assignment request formatted as a Low Voltage Differential Signal and decodes the address assignment request with a Universal Asynchronous Receiver Transmitter circuit.

19. The apparatus of claim 17 further comprising a dimmer configured to reduce an LED current through one of the plurality of LEDs by shunting at least part of the bias current with a transistor connected in parallel with the LED.

20. The apparatus of claim 17 further comprising a plurality of transistors connected in series, each transistor connected in parallel with a respective one of the plurality of LEDs and configured to shunt at least a portion of the bias current from the respective LED in response to a dimming request by the dimmer.

* * * * *